United States Patent [19]

Karasawa

[11] Patent Number: 5,436,571
[45] Date of Patent: Jul. 25, 1995

[54] PROBING TEST METHOD OF CONTACTING A PLURALITY OF PROBES OF A PROBE CARD WITH PADS ON A CHIP ON A SEMICONDUCTOR WAFER

[75] Inventor: Wataru Karasawa, Yokohama, Japan

[73] Assignee: Tokyo Electron Limited, Tokyo, Japan

[21] Appl. No.: 227,178

[22] Filed: Apr. 13, 1994

Related U.S. Application Data

[63] Continuation of Ser. No. 17,450, Feb. 12, 1993, abandoned, which is a continuation of Ser. No. 728,577, Jul. 11, 1991, abandoned.

[30] Foreign Application Priority Data

Aug. 20, 1990 [JP] Japan ................. 2-216982

[51] Int. Cl.⁶ ............................................. G01R 1/06
[52] U.S. Cl. ................................. 324/765; 324/757
[58] Field of Search ............. 324/158 R, 73.1, 158 F, 324/158 P, 760, 765, 158.1; 439/482; 358/101, 106

[56] References Cited

U.S. PATENT DOCUMENTS

| | | | |
|---|---|---|---|
| 3,453,545 | 7/1969 | Oates | 324/72.5 |
| 3,996,516 | 12/1976 | Luther | 324/158 P |
| 4,123,706 | 10/1978 | Roch | 324/158 P |
| 4,585,991 | 4/1986 | Reid et al. | 324/158 P |
| 4,758,785 | 7/1988 | Rath | 324/158 P |
| 4,780,836 | 10/1988 | Miyazaki et al. | 324/158 P |
| 4,864,227 | 9/1989 | Sato | 324/158 P |
| 4,918,383 | 4/1990 | Huff et al. | 324/158 P |
| 4,929,893 | 5/1990 | Sato et al. | 324/158 F |
| 4,943,767 | 7/1990 | Yokota | 324/158 P |

FOREIGN PATENT DOCUMENTS

| | | |
|---|---|---|
| 56-133842 | 10/1981 | Japan . |
| 64-35382 | 2/1989 | Japan . |
| 64-73632 | 3/1989 | Japan . |
| 64-84729 | 3/1989 | Japan . |
| 2290036 | 11/1990 | Japan . |

*Primary Examiner*—Vinh Nguyen
*Attorney, Agent, or Firm*—Oblon, Spivak, McClelland, Maier, & Neustadt

[57] ABSTRACT

A probing test method including contacting probe of a probe card with pad on an IC chip on a semiconductor wafer, relatively moving each of the probe along the top of each of the pad, and sending test signal to the pad through the probe. Oxide film on the top of each of the pads can be removed by relative motion between each probe and each pad at an area where they are contacted with each other, contact resistance between the probes and the pads can be reduced to a greater extent, and test signal can be more reliable transmitted between the probes and the pads.

16 Claims, 8 Drawing Sheets

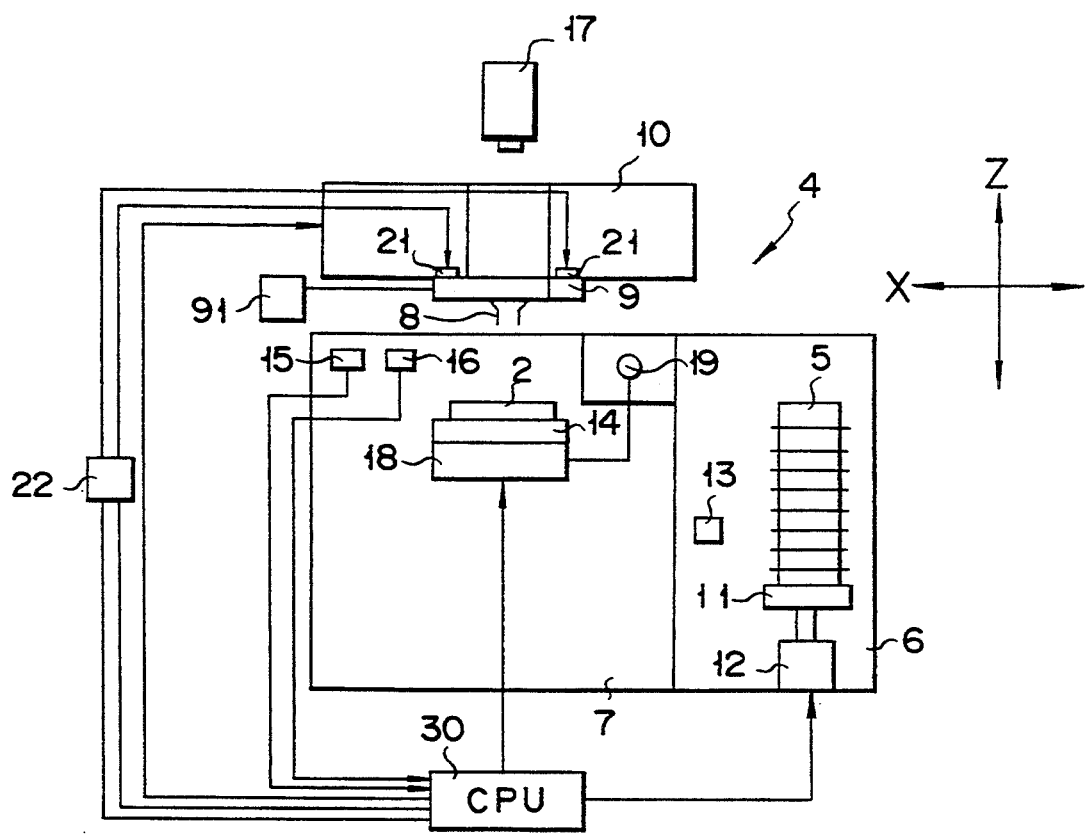
F I G. 1
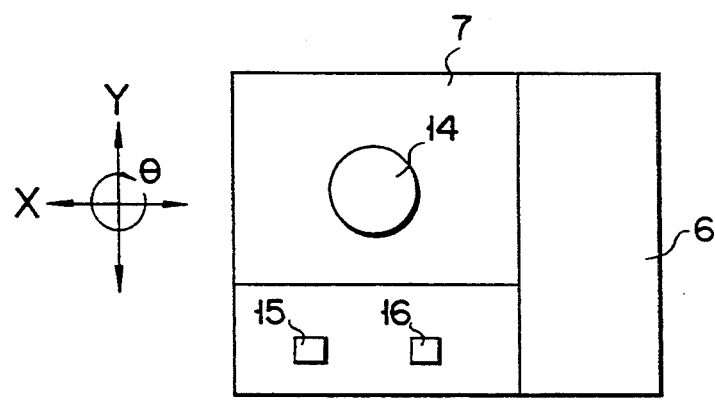
F I G. 2

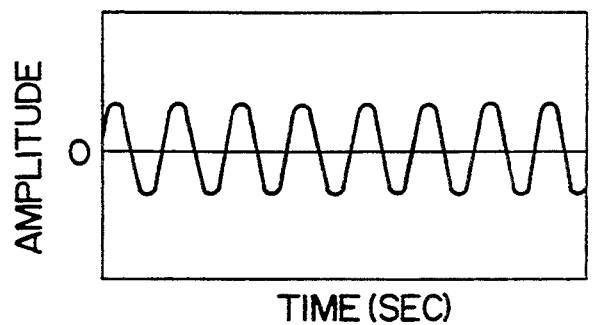
F I G. 7
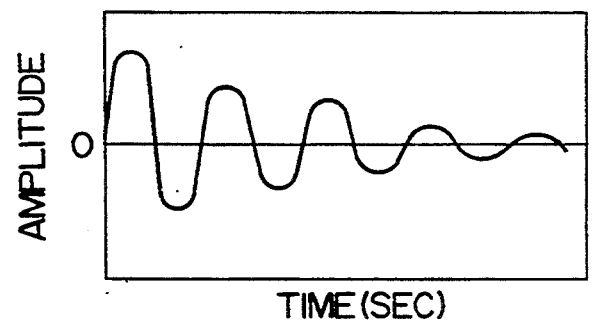
F I G. 8
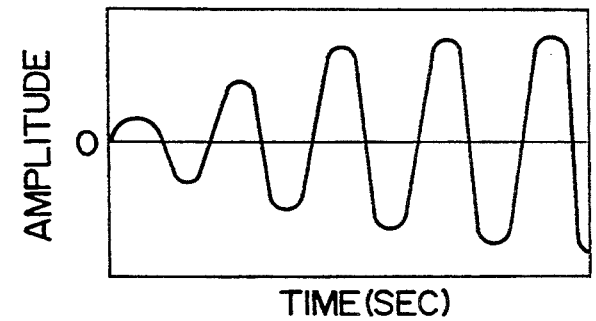
F I G. 9
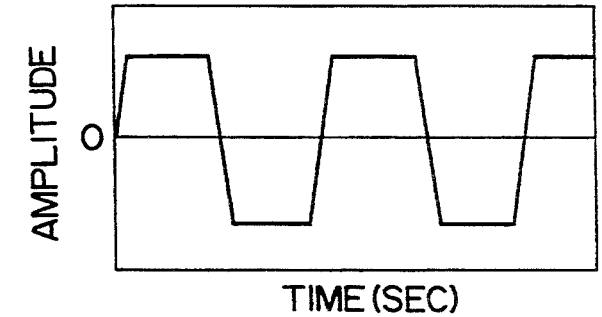
F I G. 10

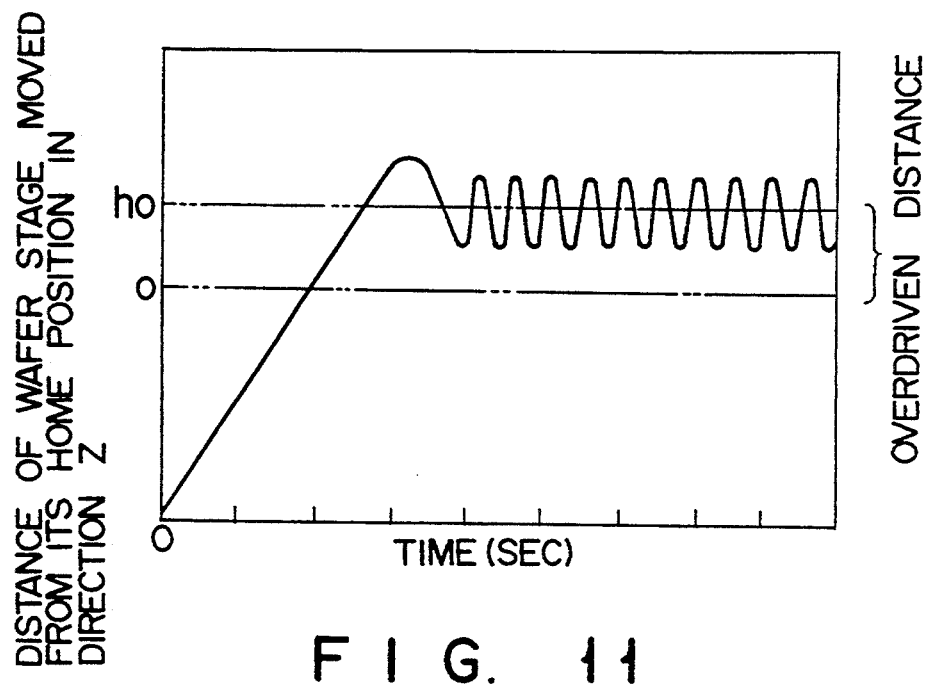
F I G. 11
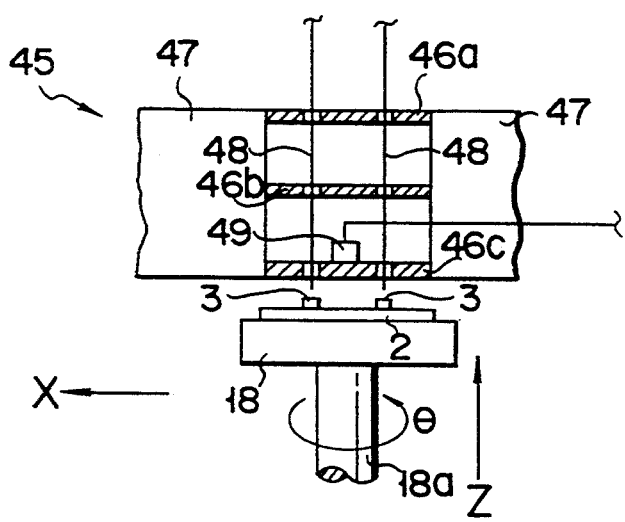
F I G. 12
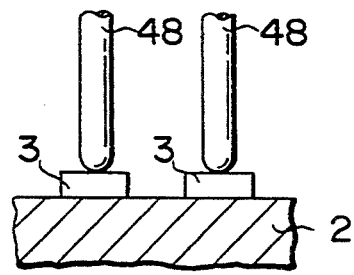
F I G. 13

PROBING TEST METHOD OF CONTACTING A PLURALITY OF PROBES OF A PROBE CARD WITH PADS ON A CHIP ON A SEMICONDUCTOR WAFER

This application is a Continuation of application Ser. No. 08/017,450, filed on Feb. 12, 1993, now abandoned, which is a File Wrapper Con. Appln. of application Ser. No. 07/728,577, filed on Jul. 11, 1991, now abandoned.

BACKGROUND OF THE INVENTION

1. Field of the Invention

The present invention relates to a probing test method of contacting a plurality of probes of a probe card with their corresponding pads on a chip on a semiconductor wafer so as to make it more reliable to electrically contact the probes with the pads.

2. Description of the Related Art

The probing test machine (which will be hereinafter referred to as prober) for conducting continuity test relative to a circuit on an IC chip on the semiconductor wafer includes loading/unloading, probing and test sections. The loading/unloading section is provided with an alignment stage. The probing section is provided with a wafer stage and a probe card. The test section is provided with a tester.

In order to automatically carry out the test by the wafer prober, the semiconductor wafer is pulled out of a cassette at the loading/unloading section, it is carried to the alignment stage and its pre-alignment, (or alignment of its orientation flat) is carried out on the alignment stage. After the pre-alignment it is carried onto the wafer stage at the probing section and pads each having a side of 60–100 μm formed on the IC chip on it are aligned with the probes. After this relative alignment between the probes and the pads, current is applied to the probes while keeping the probes contacted with the pads, and signal is sent to the tester at the test section. Responsive to the test signal applied, the tester automatically finds whether the IC chip tested is a condemned one or not.

In the probing test, the position of the probe card is previously corrected relative to the wafer state in directions X, Y, Z and θ, using a dummy wafer. Further, the arrangement of the pads on the IC chip is previously stored in a memory of the prober. The IC chip which is to become a product is probing-tasted on the basis of the memory information relating to this pad arrangement.

This probe card is attached to the underside of a test head and electric signal applied from the tester is sent to the probes through the test head. A fixed ring is attached to a base plate of the probe card and a plurality of the probes are vertically or obliquely planted on the underside of the fixed ring.

Each of the pads on the semiconductor wafer is usually made of metal such as aluminium, gold and solder alloy. This metal pad reacts with atmospheric air to form natural oxide film (such as aluminium oxide film), with which the pad surface is covered. This natural oxide film on the pad surface increases a contact resistance between the probe and the pad, thereby disturbing the transmission of test signal between the probe and the pad. It is therefore needed that contact resistance between the probe and the pad is reduced to enhance test accuracy.

Japanese Patent Disclosure Sho 64-35382 discloses a technique of controlling the lifting distance (moved amount for direction Z) of the wafer stage in such a way that the wafer stage can be overdriven in order to fully and electrically contact the vertical probes with their corresponding pads. According to this technique, the wafer stage is further lifted (or moved in the direction Z) only by a certain distance after the pads are passed over a height level (or reference level) at which they are only contacted with their corresponding probes. The pads which have been overdriven beyond the reference level are more strongly pushed against the probes, so that the natural oxide film on the pad surfaces can be broken by tips of the probes to thereby create full electric contact between the pads and the probes. However, it is extremely difficult to appropriately control the overdriven distance of the pads in the direction Z. Particularly, integrated degree of the chip became to 4 Mega, 16 Mega, 32 Mega-bits, contact surface of the pad is very small, and thickness of the pad is very thin. This causes the probes to stick into the pads themselves after breaking the oxide film on the pad surfaces, thereby forming scratches on the pad surfaces. These scratches will make wirings deficient at the following steps, thereby lowering the productivity. This becomes more remarkable as the circuit on the IC chip is more highly integrated.

When the wafer stage is overdriven beyond the reference level in the direction Z in a case where the probing test is conducted using the obliquely-planted probes, the tips of the probes bite into the pads themselves while sliding sideward on the pad surfaces, so that scratches can be formed on the pad surfaces. These scratches on the pad surfaces cause same demerits as described above.

SUMMARY OF THE INVENTION

The object of the present invention is therefore to provide a probing test method capable of rightly contacting probes of a probe card with pads on an IC chip on a wafer without causing any scratch on pad surfaces, while enhancing electric contact between the probes and the pads.

According to an aspect of the present invention, a probing test method comprises contacting a pad with a probe, relatively moving at least any of the pad and the probe along an upper surface of the pad before, after or at the time when the pad is contacted with the probe, and performing a test during said relative motion or after stopping said relative motion.

The relative motion of the pad and the probe along the probe-contacted top of the pad (which will be hereinafter referred to as relative movement in the probes-contacted pad tops) is provided on the basis of a software programming stored in a CPU. Most of the relative motion in the probe-contacted pad top is created according to the software programming stored in the CPU and a part thereof is created mechanically.

The relative motion in the probe-contacted pad top may be started after, before or at the same time the probe and the pad are contacted with the other.

Further, the period of the relative movement may be selected before probing test or while probing test.

Further, the relative motion in the probes-contacted pad top may be made by low or high frequency vibration or it may be made only once. In a case where low frequency vibration is used, its frequency is preferably in a range of 60–220 Hz. In another case where high frequency vibration is used, its frequency is preferably in a range of 15–300 KHz. In a further case where the relative motion is made only once, it is preferable that relative motion (or overdrive) of the probe and the pad in the direction Z is added to the relative motion in the probe-contacted pad top.

The relative motion in the probe-contacted pad top may be made at least in one of the directions X, Y and $\theta$ but it is more preferable to make it in two or more directions. The moving stroke (or amplitude) in each of the directions X, Y and $\theta$ is preferably in a range of 5–25 µm.

Various modes of vibration can be selected to add them to the pads or probes. Continuous and pulse vibrations can be employed, for example. In the case of the continuous vibration, it may be simple harmonic motion whose amplitude is certain or it may be attenuating vibration whose amplitude changes as time goes by. The attenuating vibration may be of the mode whose amplitude gradually becomes smaller and smaller although its initial amplitude is large or of the mode whose amplitude gradually becomes larger and larger although its initial amplitude is small.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematically view showing the whole of a probing test machine;

FIG. 2 is a plan schematically showing the main body of the probing test machine viewed from the top thereof;

FIG. 6 is a graph showing how the probe card moves from its home position in a direction Z as time goes by;

FIGS. 7 through 10 show various modes of vibration employed to add to the probe card to vibrate of the probes relative to its corresponding pad while keeping them contacted;

FIG. 11 is a graph showing, as a variation, how the probe card moves from its home position in the direction Z as time goes by;

FIG. 12 is a partial sectionally view showing a part of the test section of the probing test machine according to a second embodiment of the present invention;

FIG. 13 is a partical enlarged view showing probes contacted with their corresponding pads on an IC chip;

FIG. 15 is a graph showing, as a further variation, how the probe card moves from its home position in the direction Z as time goes by;

FIG. 16 is a graph showing how the probe card moves from its home position in the direction Z as time goes by and;

DETAILED DESCRIPTION OF THE PREFERRED EMBODIMENTS

Figure 3:
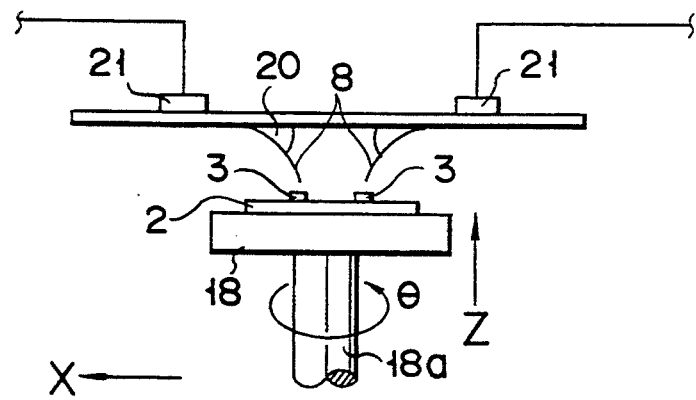
FIG. 3 is a schematically view showing a wafer stage and a probe card in the test section of the probing test machine.

Some embodiments of the present invention will be described with reference to the accompanying drawings.

As shown in FIGS. 1 and 2, the main portion of a prober 4 has a section 6 for loading and unloading wafer cassettes 5, a test section 7 in which probing tests are conducted, and a test head 10 provided with a probe card 9. The test head 10 is positioned to face probes 8 of the probe card 9 relative to the top of the test section 7.

The loading/unloading section 6 is provided with a table 11 on which cassettes 5 each including 25 sheets of semiconductor wafers 2 therein, for example, are mounted. This table 11 is connected to a lifter 12 which is controlled by a CPU 30.

The loading/unloading section 6 is also provided with a carrying arm (not shown), by which the semiconductor wafers 2 are pulled out of the cassette 5 one by one and carried onto a pre-alignment stage 13.

The pre-alignment stage 13 is provided with an optical sensor (not shown) and a stage drive system (not shown). This optical sensor includes light shooting and receiving sections to detect the circumferential rim of the semiconductor wafer 2. This enables pre-alignment (or ori-fla alignment) to be achieved so as to direct the orientation flat (or ori-fla) of the semiconductor wafer an any desired direction. The accuracy of this pre-alignment is relatively low (low alignment).

The test section 7 is provided with a handling device (not shown) for transferring the semiconductor wafer 2 which has been pre-aligned. A wafer chuck 14 serves to hold the semiconductor wafer 2 horizontal and it is arranged on an X-Y-Z-$\theta$ stage 18. A power source for motors (not shown) for driving the stage 18 in the directions X, Y, Z and $\theta$ is connected to the output side of the CPU 30. When the stage 18 is driven in the direction $\theta$, it is rotated round a shaft (or shaft z) 18a, as shown in FIG. 3.

The wafer chuck 14 is provided with a handling device (not shown) such as the vacuum sucking means so as to accurately carry the semiconductor wafer 2 which has been pre-aligned, while keeping the ori-fla of the semiconductor wafer 2 directed as it has been directed at the pre-alignment. The moving stroke of the wafer chuck 14 is full-automatically controlled by the CPU 30.

The test head 10 is arranged facing the top of the test section 7. It conducts pre-alignments and measurements responsive to outputs applied from the CPU 30 into which detection information is inputted.

The X-Y-Z-$\theta$ stage 18 is connected to a joystick 19 which is used in accordance with manual operation. This joystick 19 can control the moving distance or amount of the X-Y-Z-$\theta$ stage 18 in the order of micron. A microscope 17 is located above the test head 10. The operator operates the joystick 19 while viewing through the microscope 17. This operation is used by teaching or manual alignment.

As shown in FIG. 2, a CCD camera 15 and a height sensor 16 are located at appropriate positions in the test section 7. The CCD camera 15 is arranged to focus its lens on the wafer 2 on the wafer stage 14. The height sensor 16 is of the non-contact type, having optical distance sensor elements. It is detected by the height sensor 16 what height the top of the pads 3 on the wafer 2 on the stage 14 has relative to a reference height level. The wafer 2 on the stage 14 and the probe card 9 are aligned With each other (alignment of the pads 3 and the probes 8), using these CCD camera 15 and height sensor 16.

As shown in FIG. 1, the CCD camera 15 and the height sensor 16 are connected to the input side of the CPU 30. The CPU 30 sends alignment command signals to the X-Y-Z-$\theta$ stage 18 in response to image information applied from the CCD camera 15 and height levels detected by the height sensor 16.

The probe card 9 is set to the test head 10. The probe card 9 is rotated to a desired extent in the direction $\theta$ by an insert ring (not shown) connected to a rotary system 90 at the time when the probes 8 on the probe card 9 are to be aligned relative to the pads 3 on the wafer 2. A plurality of the probes 8 are planted on the probe card 9 to contact the pads 3 on an IC chip. These probes 8 are slender, straight and elastic, and are attached to the probe card 9 in such a certain arrangement as to meet kinds and sizes of the semiconductor wafers 2. They are made of metal such as austenite stainless steel or tungsten, excellent in wear-resistance.

A touch sensor (not shown) is attached to the probe card 9 at an appropriate position thereof. This touch sensor is connected to the probes 8 at one ends of its lead lines and to the input side of the CPU 30 at the other ends thereof.

As shown in FIG. 3, plural vibrators 21 are attached to the top of the probe card 9 at appropriate positions thereof. Each of the vibrators 21 is connected to a low frequency power supply 22 which is controlled by the CPU 30. Low frequency piezo-element such as are used as the vibrators 21. High frequency piezo-elements made of $LiNbO_3$, $LiTaO_3$ or the like may be used instead as the vibrators 21. It is preferable that the vibrators 21 are attached to the top of the probe card 9 at four corners or sides thereof. Further, the number of the vibrators 21 used is preferably from one to eight, most preferably four. In a case where four of the vibrators 21 are to be attached to the probe card 9, one set of the two vibrators 21 is attached to the probe card 9 in such a way that they can vibrate in the direction X and another set of the remaining two vibrators 21 is attached to it in such a way that they can vibrate in the direction Y. It may be arranged not that vibration is added to the probe card 9 but that vibration is added directly to the probes 8 through vibrators different from the vibrators 21.

The power supply 22 is not limited to the low frequency one but a high frequency power supply for applying high frequency voltage to the vibrators 21 may be used.

Figure 4:
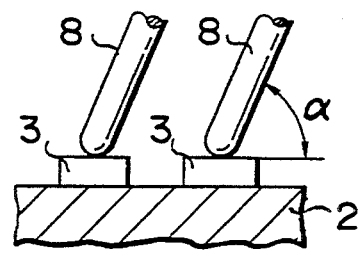
FIG. 4 is a partly enlarged view showing probes contacted with pads on an IC chip.

As shown in FIG. 4, each of the probes 8 is tilted relative to the top (or horizontal plane) of its corresponding pad 3 on the wafer 2 at a certain angle $\alpha$. This angle $\alpha$ is usually in a arrange of 84°–97°, and it is 84°±2° in this example. In a case where 500 of the pads 3 are formed on an IC chip, one side of the top of each of the pads 3 has a length of about 100 $\mu$m and the front portion of each of the probes 8 has a diameter of about 60 $\mu$m.

The microscope 17 is located above the test head 10. This microscope 17 can be operated by the operator to enable the operator to directly view each pad 3 on the wafer 2 on the wafer stage 14.

The wafer prober 4 is provided with a probe cards housing section (not shown). The wafer prober 4 is further provided with a carrier system (not shown), which picks up such a probe card 9 out of the probe cards housing section as to meet the kind of the semiconductor wafer tested and sets it while aligning it with the insert ring.

Figure 5:
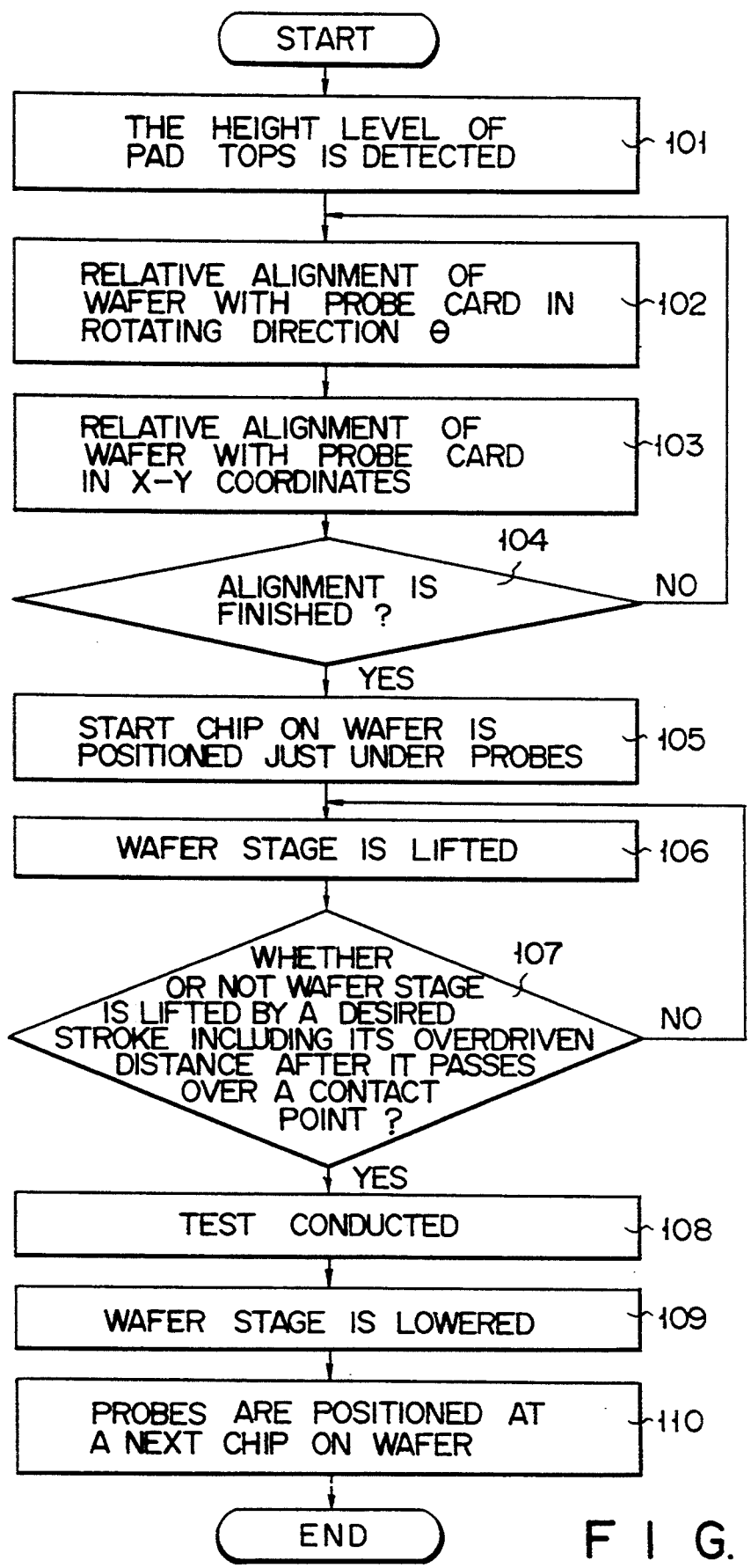
FIG. 5 is a flow chart intended to explain the probing test method according to a first embodiment of the present invention.

The probing test method according to a first embodiment of the present invention will be described with reference to a flow chart in FIG. 5.

After the ori-fla of a dummy wafer DW is aligned on the pre-alignment stage 13 at the loading/unloading section 6, it is carried onto the chuck 14. The stage 18 is lifted to contact the probes 8 with the dummy wafer DW and to make probe traces on the dummy wafer DW. The stage 18 is moved to the position of the CCD camera 15 and the probe traces on the dummy wafer DW are photographed by the CCD camera 15.

One of the probe traces photographed by the CCD camera 15 is used as a reference probe trace. The operator operates the joystick 19 to move the stage 18 in such a way that the cross-mark of the CCD camera 15 can coincide with the reference probe trace on the dummy wafer DW in the field of vision. The position at which the cross-mark of the CCD camera 15 can coincide with the reference probe trace is stored in the CPU 30.

Using this position as a reference (or starting point) and following the moving distance or amount of the camera 15 previously stored in the CPU 30, the cross-mark of the camera 15 is moved to the predicted position of a second probe trace on the dummy wafer DW. When the cross-mark of the camera 15 coincides with the second probe trace in the field of vision, no positional shift in the rotating direction $\theta$ exists between the probe card 9 and the dummy wafer DW and the process advances to a next step.

When the cross-mark of the camera 15 does not coincide with the second probe trace in the field of vision, however, it is thought that some positional shift in the rotating direction $\theta$ exists between the probe card 9 and the dummy wafer DW. The operator therefore operates the joystick 19 to cause the cross-mark of the camera 15 to coincide with the second true probe trace in the field of vision and this position at which the cross-mark of the camera 15 coincides with the second true probe trace is stored in the CPU 30. The positional shift $\theta$b in the rotating direction $\theta$ is calculated in the CPU 30. The probe card 9 is rotated on the basis of this positional shift $\theta$b by $-\theta$b by the rotation system 91 and the positional shift in the rotating direction $\theta$ is thus corrected.

The dummy wafer DW is unloaded from the wafer stage 18 and a semiconductor wafer 2 which will be made as a product is loaded on the stage 18. About 500 units of the pads 3 are formed on each of the IC chips on the wafer 2. The height of tops of the pads 3 on the wafer is detected by the height sensor 16 and the value thus detected is stored in the CPU 30 (step 101).

According to the process as described above, the wafer 2 and the probe card 9 are aligned with each other in the rotating direction $\theta$ (step 102).

The X-Y-Z-$\theta$ stage 18 is a little moved in the directions X and Y to micro-adjust their relative alignment between the wafer 2 and the probe card 9 in the coordinates of X and Y (step 103).

When the position of the stage 18 is controlled by the CPU 30 and the pads 3 is thus caused to coincide with the probes 8 in the coordinates of X and Y, alignment process is finished (step 104) and the process advances to a next step 105. When the pads 3 do not coincide with the probes 8 this time in the coordinates of X and Y, the process is returned from the step 104 to the step 102 and same process as described above is repeated.

The X-Y-Z-$\theta$ stage 18 is moved on the plane of the coordinates X and Y to position a start chip just under the probes 8 (step 105).

The X-Y-Z-$\theta$ stage 18 is lifted at a predetermined speed (step 106). When the pads 3 are contacted with their corresponding probes 8, as shown in FIG. 4, and the stage 18 is passed through a contact point (or position at which the wafer stage 18 is separated from its home position by a distance h in height), the probes 8 are pushed upward by the pads 3 and thus bent. The CPU 30 judges whether or not the stage 18 is passed through the contact point and lifted only a pre-stored stroke including its overdriven distance (ho-h) (step 107). The steps 106 and 107 are repeated until the desired stroke is obtained. The overdriven distance of the stage 18 is previously inputted, as a predetermined parameter, into the memory of the CPU 30.

Figure 6:
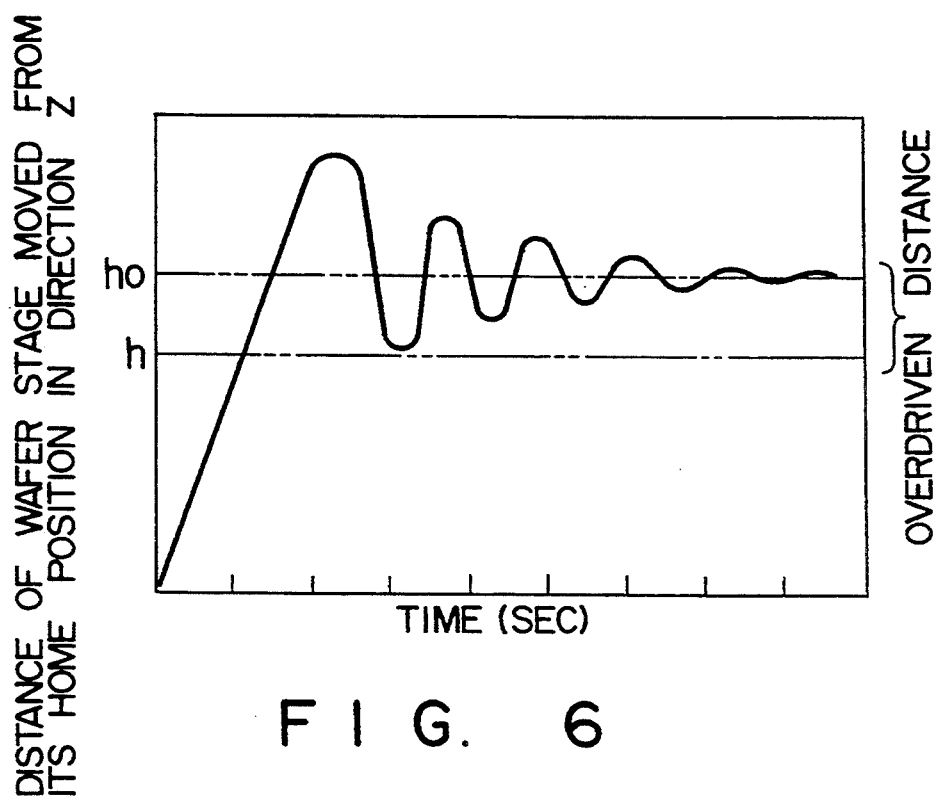

As shown in FIG. 6, the wafer stage 18 overshoots its desired overdriven distance (ho-h) in the direction Z, so that the pads 3 can be contacted with the probes 8. The desired value of its overshot distance is 10 $\mu$m and that of its overdriven distance (ho-h) is 5 $\mu$m, for example. Its lifting is stopped at the overdriven point (ho) and it is then brought to a halt while attenuation-vibrating in the direction Z.

The touch sensor (not shown) is made operative when the pads 3 are contacted with their corresponding probes 8, and contact signal is applied to the CPU 30. Command signal is then sent from the CPU 30 to the power source 22 and current is applied to the vibrators 21. Low frequency vibration is thus added from each of the vibrators 21 to the probe card 9. The amplitude of this low frequency vibration is set about 10 $\mu$m.

Vibration is not necessarily added to the probe card 9 at the same time the pads 3 are contacted with their corresponding probes 8, but it may be added to the probe card 9 before or after the pads 3 are contacted with the probes 8. In the case where vibration is to be added to the probe card 9 before or after the pads 3 are contacted with the probes 8, a certain program is previously stored in the CPU 30 and the timing of adding vibration to the probe card 9 is controlled on the basis of this program.

It may be arranged that low frequency vibration is added to the probe card 9 only in the direction X but it is more preferable that low frequency vibration is added to the probe card 9 in the directions X and Y.

As shown in FIGS. 7 through 10, various kinds of vibration mode are used to add vibration to the probe card 9 in a plane where each of the probes is contacted with its corresponding pad. Sine wave, rectangular wave, pulse wave and the like can be used as the vibration modes. Vibration may be continuously added to the probe card 9 or pulse vibration may be intermittently added to the probe card 9.

Vibrations of those modes shown in FIGS. 7 through 10 may be added to the probe card 9 while adding simple harmonic motion to the stage 18 which is under overdriven state in the direction Z, as shown in FIG. 11.

When vibration is transmitted to the probes 8 in the plane of the X-Y coordinates as described above, the top of each of the pads 3 is rubbed by the tip of the probe 8 to thereby eliminate a part of aluminium oxide film from the top of the pad 3. As the result, contact resistance between the pad 3 and the probe 8 can be made small.

Test signal is sent from the tester to the probes 8 while vibrating the probe card 9, and the circuit on the start chip is thus tested through the pads 3 (step 108).

When the probing test is finished relating to the start chip, the adding of vibration to the probe card 9 is stopped and the wafer stage 18 is lowered to its home position (step 109).

The stage 18 is moved in the plane of X and Y to position a next IC chip just under the probes 8 (step 110). The process starting from the step 101 and ending with the step 110 is repeated under full automatic control. All of the chips on a sheet of the semiconductor wafer 2 are tested by repeating this process successively. When test is finished relating to all of the chips on the semiconductor wafer 2, the semiconductor wafer 2 is returned from the stage 18 to the cassette 5 by the carrier means.

The probing test method according to a second embodiment of the present invention will be described referring to FIGS. 12 through 16. Description on same parts of the second probing test method as those of the first one will be omitted.

A probe card 45 having vertical probes 48 is used in the second probing test method. Three guide plates 46$a$, 46$b$ and 46$c$ are arranged in an opening of a lower member 47 of the probe card 45. The upper end of each of the probes 48 is fixed to a probe card body (not shown). Each of the guide plates is provided with micro-bores through which the probes 48 are passed. The lower end of each of the probes 48 is projected downward from the lower guide plate 46$c$, passing through the micro-bore of the guide plate 46$c$.

Plural vibrators 49 are attached to the lower guide plate 46$c$. The vibrators 49 are similar to those used in the first probing test method. Each of the vibrators is connected to the input side of the CPU 30.

The second probing test method will be described referring to a flow chart in FIG. 14.

After the wafer 2 is mounted on the chuck 14, the height of the tops of the pads 3 are detected and the value thus detected is inputted into the CPU 30 (step The wafer 2 and the probe card 45 are aligned with each other in the rotating direction $\theta$ (step 202).

The wafer stage 18 is a little moved in the directions X and Y to micro-adjust the relative alignment of the wafer 2 with the probe card 45 in the coordinates of X and Y (step 203). When the position of the stage 18 is controlled by the CPU 30 and the pads 3 on the wafer 2 are thus caused to coincide with their corresponding probes 45 in the coordinates of X and Y, alignment process is finished (step 204) and the process advances to a next step 205. When the pads 3 on the wafer 2 do not coincide with their corresponding probes 45 on the plane of the X-Y coordinates, the process is returned from the step 204 to the step 202 and same process as described above is repeated.

The X-Y-Z-$\theta$ stage 18 is moved on the plane of the X-Y coordinates to position a start chip on the wafer 2 just under the probes 48 (step 205).

Figure 14:
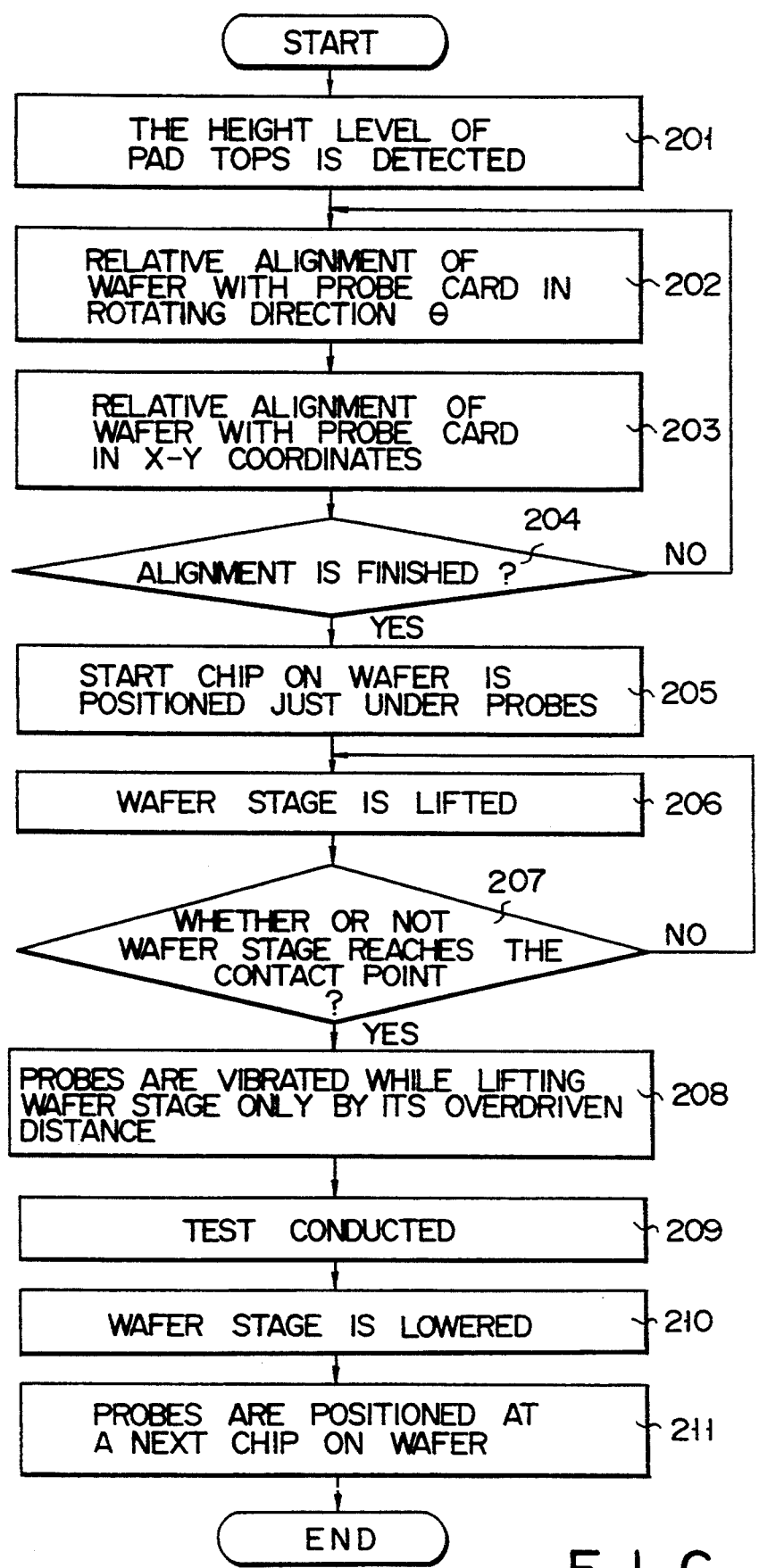
FIG. 14 is a flow chart intended to explain the probing test method according to a second embodiment of the present invention.

The wafer stage 18 is lifted at a certain speed to a contact point where the pads 3 on the wafer 2 are contacted with their corresponding probes 48, as shown in FIG. 14 (steps 206 and 207). When it is detected that the wafer stage 18 has reached the contact point, the lifting speed of the wafer stage 18 is reduced and the vibrators 49 are vibrated. The probes 48 are vibrated in the directions X, Y and θ while lifting the wafer stage 18 at low speed (step 208).

Figure 15:
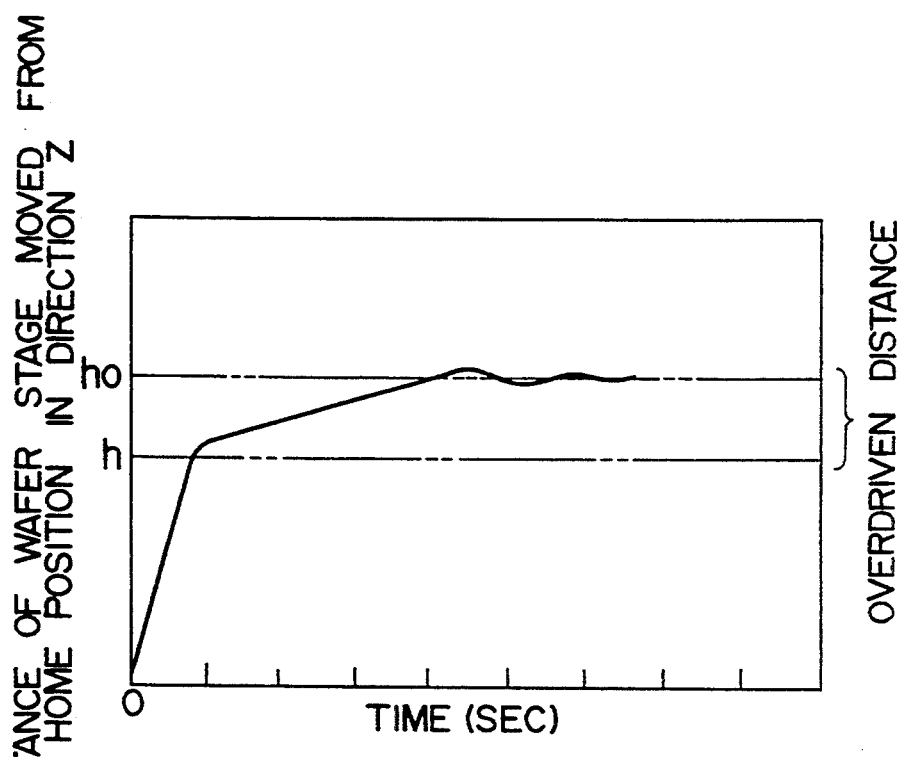
Figure 16:
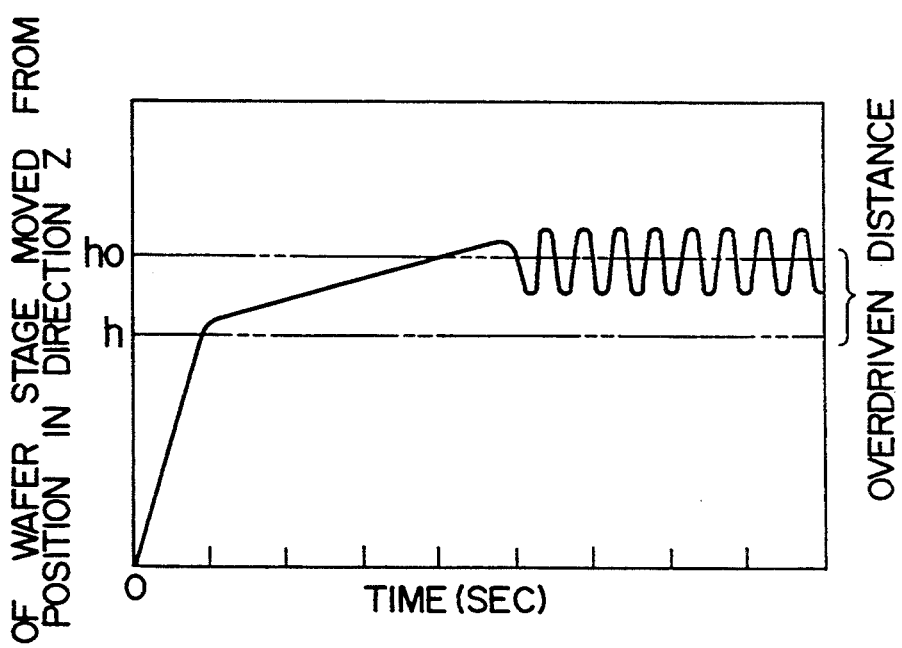

After passing over the contact point, the wafer stage 18 is lifted at low speed and overdrive is added to the wafer stage 18 over a relatively long time period, as shown in FIG. 15. The wafer stage 18 may be vibrated in the direction Z, taking the overdrive position (ho) as its center, as shown in FIG. 16.

While vibrating the probe card 45 in an area where the pads 3 on the wafer 2 are contacted with their corresponding probes 48, test signal is sent from the tester to the probes 48 and the circuit on the start chip is thus tested through the pads 3 (step 209).

When the probing test is finished relating to the start chip, vibration adding to the probe card 45 is stopped and the wafer stage 18 is lowered to its home position (step 210).

The stage 18 is moved in the plane of X and Y to position a next chip on the wafer 2 just under the probes 48 (step 211). The process starting from the step 201 and ending with the step 211 is then repeated under full automatic control.

Figure 17:
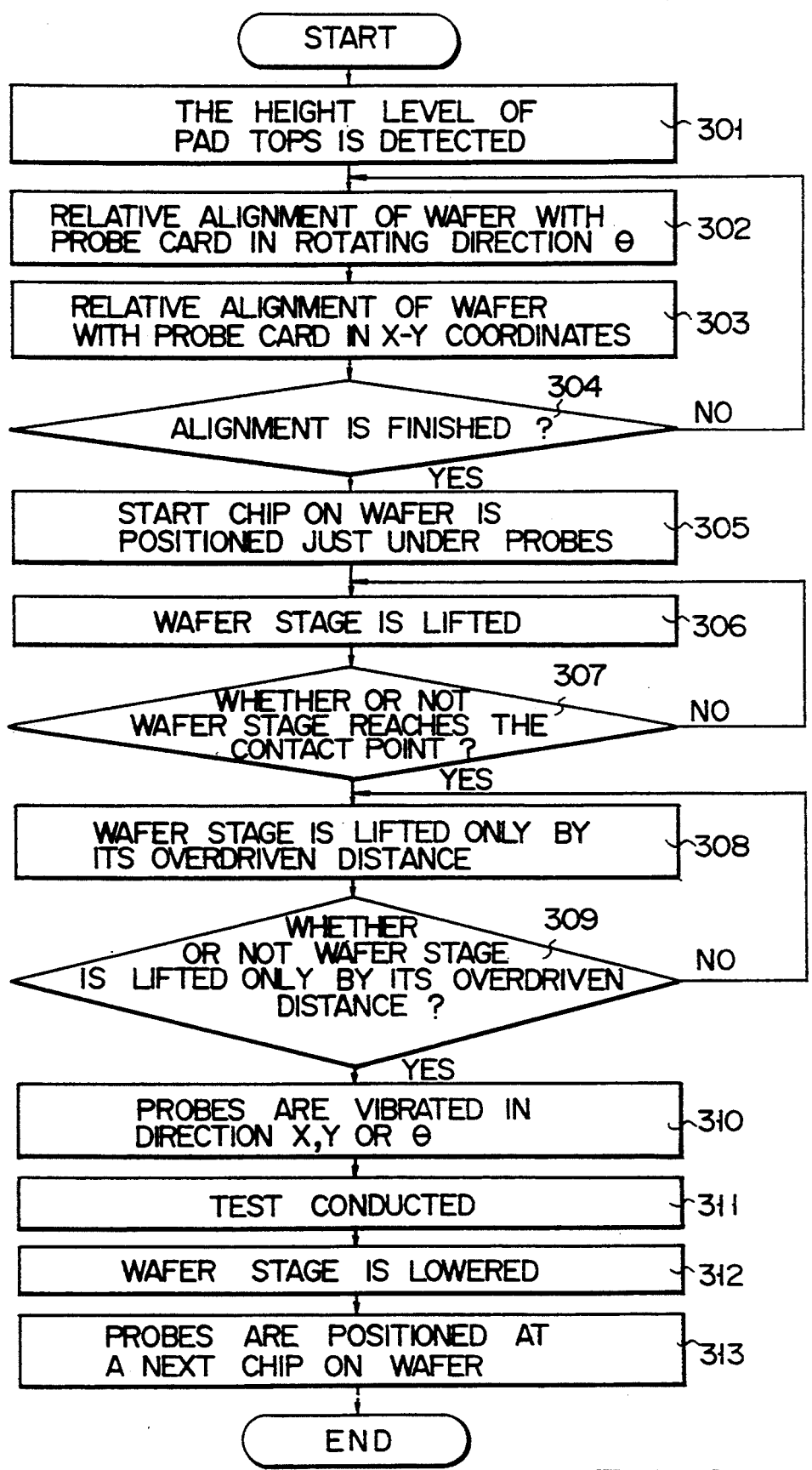
FIG. 17 is a flow chart intended to explain the probing test method according to a third embodiment of the present invention.

The probing test method according to a third embodiment of the present invention will be described referring to FIG. 17. Description on same parts of the third probing test method as those of the first and second ones will be omitted.

After the wafer 2 is mounted on the chuck 14, the height of the tops of the pads 3 on the wafer 2 is detected and the value thus detected is applied to the CPU 30 (step 301). The wafer 2 and the probe card 45 are aligned with each other in the rotating direction θ (step 302).

The wafer stage 18 is a little moved in the directions X and Y to micro-adjust the relative alignment of the wafer 2 with the probe card 45 in the coordinates of x and Y (step 303). When the position of the stage 18 is controlled by the CPU 30 and the pads 3 on the wafer 2 are thus caused to coincide with the probes 48 of the probe card 45 in the coordinates of X and Y, the alignment process is finished (step 304) and the process advances to a next step 305.

The wafer stage 18 is moved in the plane of the X-Y coordinates to position a start chip on the wafer 2 right under the probes 48 (step 305).

The wafer stage 18 is lifted at a certain speed to the contact point where the pads 3 on the wafer 2 are contacted with their corresponding probes 48, as shown in FIG. 13 (steps 306 and 307). When it is detected that the wafer stage 18 has reached the contact point, the wafer stage 18 is lifted only by its overdriven distance (ho-h) (step 308 and 309). After it is stopped, the vibrators 49 are vibrated to add vibration to the probes 48 in the directions X, Y and θ (step 310).

While adding vibration to the probe card 45 in an area where the pads 3 on the wafer 2 are contacted with their corresponding probes 48, test signal is sent from the tester to the probes 48 and the circuit on the start chip is thus tested through the pads 3 (step 311).

When the probing test is finished relating to the start chip, vibration adding to the probe card 45 is stopped and the wafer stage 18 is lowered to its home position (step 312).

The stage 18 is moved in the plane of X and Y to position a next IC chip on the wafer 2 right under the probes 48 (step 313).

Although those cases where the present invention is applied to the wafer prober have been described, the present invention is not limited to the wafer prober but it can be applied to the other test devices which use the probes, such as the device prober intended to test IC elements which comprise chips mounted on a lead frame, and the LCD prober intended to test liquid crystal display substrates.

According to the present invention, test accuracy can be enhanced because contact resistance between the pads and the probes can be reduced to a greater extent. Particularly because each of the probes is moved along the top of its corresponding pad in the directions X, Y and θ, the top of the pad is not scratched by the probe, thereby enabling the productivity to be enhanced. Further, even when the wafer stage is kept overdriven, the tip of each of the probes is not held on the top of its corresponding pad only at a specific point thereof. This enables the extent of scratch which may be added to the tops of the pads to be made negligible.

Additional advantages and modifications will readily occur to those skilled in the art. Therefore, the invention in its broader aspects is not limited to the specific details, and illustrated examples shown and described herein. Accordingly, various modifications may be without departing from the spirit or scope of the general inventive concept as defined by the appended claims and their equivalents.

What is claimed is:

1. A probing test method comprising:
a step of placing a semiconductor wafer to be examined on a test stage, with an upper surface of a conductive pad of the wafer being kept substantially horizontal, said conductive pad covered by an oxide film;
a step of positioning the conductive pad and a probe, which is slender, straight and elastic, relative to each other with the probe vertically supported by a probe card;
a contacting step of causing the conductive pad to be moved in a Z direction by an elevator means, and bringing a tip of the probe into a substantially perpendicular contact with the upper surface of the conductive pad;
an over-drive step of causing the probe to be pressed against the upper surface of the conductive pad by the elevator means, comprising,
detecting a height level of the upper surface of the conductive pad relative to a tip of the probe by an optical distance sensor not in contact with the conductive pad, and
controlling an over-drive amount in said over-drive step in accordance with the detected height level of the upper surface of the conductive pad;
a step of relatively moving the probe, at least when the conductive pad and the probe are in contact with each other, relative to the conductive pad in a horizontal plane in at least one of an X direction, a Y direction and a Θ rotational direction and simultaneously relatively moving the conductive pad relative to the probe in a vertical plane in a Z direction so that the probe breaks the oxide film covering said conductive pad and comes into electrical contact with said conductive pad; and a step of supplying a test signal from the probe to the conductive pad after the conductive pad and the probe are moved relative to each other to test for electrical connection.

2. The probing test method according to claim 1, wherein said probe is stationary, and in said moving step, the test stage is moved relative to the stationary probe in the horizontal plane in one of the X direction, the Y direction and the Θ rotational direction.

3. The probing test method according to claim 2, wherein the probe card is applied with vibration after the conductive pad and the probe are brought into contact with each other, and the conductive pad and the probe are overdriven and thereby pressed against each other, with the vibration being kept applied to the probe card.

4. The probing test method according to claim 1, wherein in said positioning step, the test stage is moved in the Θ rotational direction relative to the probe, and is further moved in the X and Y directions.

5. The probing test method according to claim 1, wherein said probe is vibrated at low frequency.

6. The probing test method according to claim 1, wherein said probe is vibrated at high frequency.

7. The probing test method according to claim 1, wherein said probe is obliquely contacted with said upper surface of their corresponding conductive pad.

8. The probing test method according to claim 1, wherein after the probe is further pushed against the conductive pad, passing over a point where the probe is contacted with the conductive pad, the probe and the conductive pad are moved relative to one other.

9. The probing test method according to claim 1, further comprising detecting that the conductive pad is contacted with the probe, and relatively moving the probe on the basis of the result thus detected.

10. The probing test method according to claim 1, wherein said relatively moving step comprises vibrating one of said conductive pad and said probe at a frequency of 60 to 220 Hz.

11. The probing test method according to claim 1, wherein said relatively moving step comprises vibrating one of said pad and said probe at a frequency of 15 to 300 kHz.

12. The probing test method according to claim 1, wherein said conductive pad is formed of aluminum, gold and solder alloy.

13. The probing test method according to claim 1, wherein said step of relatively moving comprises vibrating said conductive pad in said vertical plane in the Z direction while relatively moving said probe in the horizontal plane.

14. A probing test method comprising the steps of:
providing vibration-application means for a probe card comprising a probe;
placing a semiconductor wafer to be examined on a test stage, with an upper surface of a conductive pad of the wafer being kept substantially horizontal, said conductive pad covered by an oxide film;
positioning the conductive pad and the probe, which is slender, straight and elastic, relative to each other with the probe vertically supported by a probe card;
causing at least one of the conductive pad and the probe to be moved in a Z direction by an elevator means;
bringing a tip of the probe into a substantially perpendicular contact with the upper surface of the conductive pad;
causing the probe to be over-driven by the elevator means, thereby pressing the probe against the upper surface of the conductive pad, comprising, detecting a height level of the upper surface of the conductive pad of the substrate relative to a tip of the probe by an optical distance sensor not in contact with the conductive pad, and
controlling an over-drive amount in said over driving in accordance with the detected height level of the upper surface of the conductive pad;
relatively moving the probe card and the conductive pad, comprising causing the probe card to vibrate in a horizontal plane in at least one of an X direction, a Y direction and a Θ rotational direction by said vibration-application means, at least when the conductive pad and the probe are in contact with each other, and simultaneously moving the conductive pad in a vertical plane in a Z direction so that the probe breaks said oxide film and comes into electrical contact with said conductive pad; and
supplying a test signal from the probe to the conductive pad after the probe card is caused to vibrate.

15. The probing test method according to claim 14, wherein the probe card is applied with vibration after the conductive pad and the probe are pressed against each other by over driving.

16. The probing test method according to claim 14, wherein said step of relatively moving comprises:
vibrating the conductive pad in the vertical plane in the Z direction while simultaneously vibrating the probe card in the horizontal plane.

* * * * *